(12) United States Patent
He et al.

(10) Patent No.: US 6,445,204 B1
(45) Date of Patent: Sep. 3, 2002

(54) APPARATUS FOR PROBING DIGITAL SIGNALS WITHIN PRINTED CIRCUIT BOARDS

(75) Inventors: Jane J. He, Ottawa; Liguo Zhao, Nepean, both of (CA)

(73) Assignee: Nortel Networks Limited, St. Laurent (CA)

(*) Notice: Subject to any disclaimer, the term of this patent is extended or adjusted under 35 U.S.C. 154(b) by 5 days.

(21) Appl. No.: 09/731,762

(22) Filed: Dec. 8, 2000

(51) Int. Cl.⁷ ............................................. G01R 31/28
(52) U.S. Cl. .................................... 324/763; 324/158.1
(58) Field of Search .............................. 324/754, 158.1, 324/620, 624, 625, 628, 763; 361/777; 333/124, 137, 130

(56) References Cited

U.S. PATENT DOCUMENTS

| | | | |
|---|---|---|---|
| 5,365,205 A | | 11/1994 | Wong ......................... 333/109 |
| 5,751,152 A | * | 5/1998 | Dubose et al. ............... 324/628 |
| 5,764,489 A | * | 6/1998 | Leigh et al. ................. 361/777 |
| 5,983,006 A | * | 11/1999 | Carlson et al. ......... 395/500.05 |
| 5,986,893 A | * | 11/1999 | Leigh et al. ................. 361/777 |
| 6,128,769 A | * | 10/2000 | Carlson et al. ................. 716/6 |
| 6,225,816 B1 | * | 5/2001 | Draving et al. ............. 324/754 |
| 6,243,653 B1 | * | 6/2001 | Findley ....................... 702/65 |

OTHER PUBLICATIONS

XA–CORE VSOC Backplane, Alexandre Guterman, Nortel Networks Design Forum, Apr. 20–22, 1999, Proprietary, pp. 1–6.

\* cited by examiner

*Primary Examiner*—Michael Sherry
*Assistant Examiner*—Jimmy Nguyen
(74) *Attorney, Agent, or Firm*—Allah P. Millard

(57) ABSTRACT

In order to probe digital signals within a Printed Circuit Board (PCB) a sensor apparatus is implemented adjacent to a signal trace. The sensor apparatus receives crosstalk signalling from the signal trace and is coupled to a probing node capable of being probed by a test apparatus. Hence, in essence, the signal trace itself can be probed via the sensor apparatus and the probing node. The probing node can be implemented on the same layer of the PCB as its corresponding sensor apparatus or on a different layer that is more convenient for probing purposes. Further, the sensor apparatus could be implemented on the same layer within the PCB as its corresponding signal trace or alternatively could be implemented on an adjacent layer that still allows the sensor apparatus to receive crosstalk signalling from the signal trace. With the use of the sensor apparatus in combination with the probing node, it is possible to achieve accurate measurements of signals traversing the signal trace without significantly affecting the signal integrity of the signals traversing the signal trace. This is especially important in high speed designs.

42 Claims, 9 Drawing Sheets

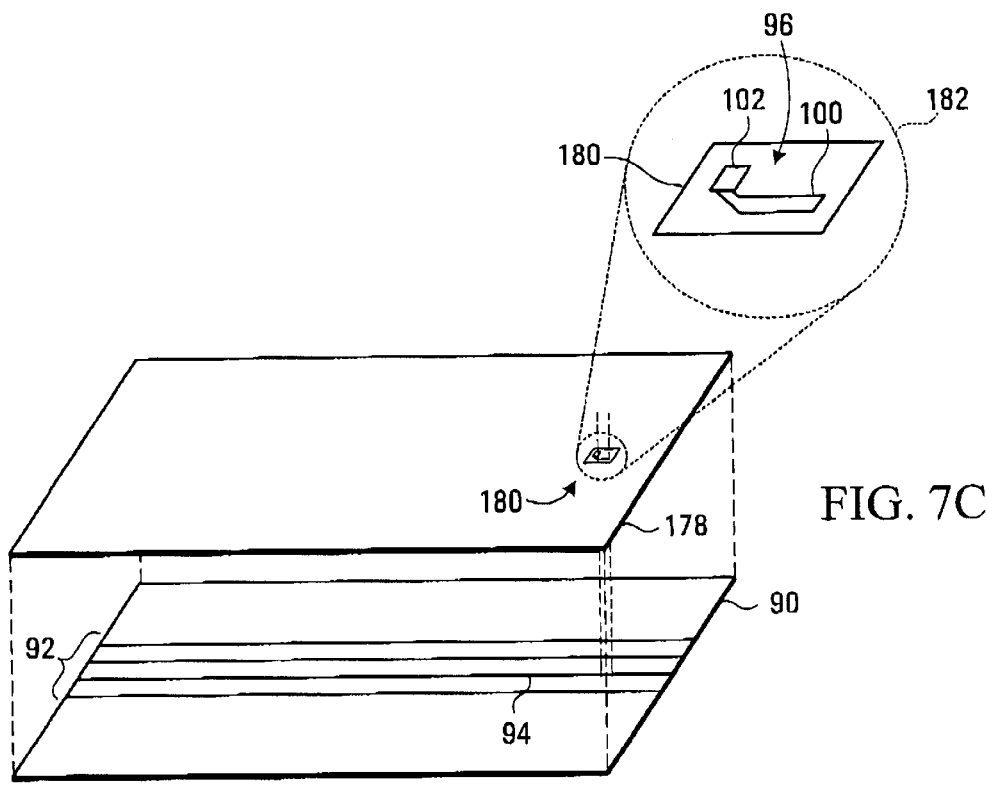
FIG. 7C
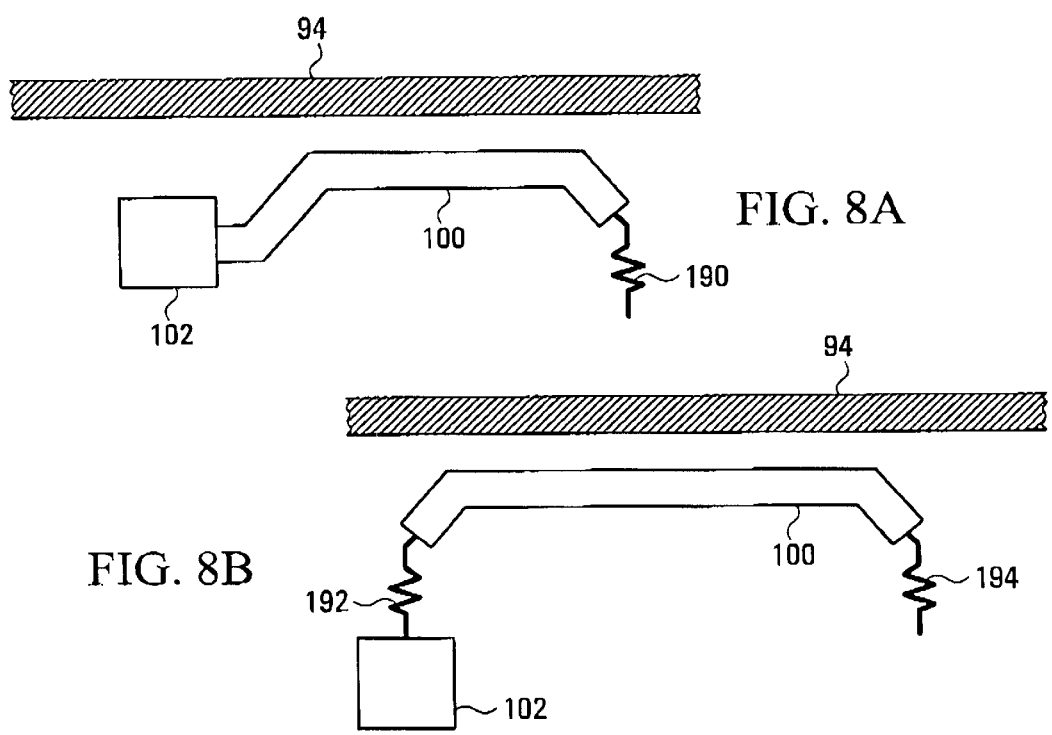
FIG. 8A
FIG. 8B

APPARATUS FOR PROBING DIGITAL SIGNALS WITHIN PRINTED CIRCUIT BOARDS

FIELD OF THE INVENTION

This invention relates generally to probing digital signals and more specifically to probing digital signals within Printed Circuit Boards (PCBs).

BACKGROUND OF THE INVENTION

PCBs comprise a number of microelectronic components that are interconnected in order to perform a particular function or set of functions. Examples of components that could be integrated within a PCB include memory devices, Application Specific Integrated Circuits a(ASICs) and processing devices such as Digital Signal Processors (DSs). The components within a PCB communicate with each other via signal traces from a plurality of drivers to a plurality of receivers. As defined herein below, a driver is an apparatus which outputs a signal while a receiver is an apparatus that receives a signal. It should be understood that normally a microelectronic component within a PCB would comprise one or more drivers along with one or more receivers.

One critical aspect of a PCB design procedure is the testing of the functionality and connectivity of the various signals being transmitted from one microelectronic component to another. The testing of individual signals within the PCB can allow the designer to ensure that the components are operating properly and that all interconnections between specific drivers and receivers are correct. Further, in the case that components are not operating properly, the testing of the signals within the PCB can allow a designer to isolate the problems.

One technique for testing the signals within a PCB, as illustrated in FIG. 1A, is the use of internal testing circuitry within the components. Within FIG. 1A, a first component 30 comprises functional mode and test mode circuitry 32, 34 that are each coupled to a driver 36. The driver 36 is coupled, via a signal trace 38 to a second component 40 that comprises a receiver 42 coupled to the signal trace 38 and detector circuitry 44 coupled to the receiver 42. In this case, the first component 30 can operate either in functional mode with functional mode circuitry 32 or in test mode with test mode circuitry 34, the component 30 selecting between the two modes with the use of a test signal that can be dictated by a test engineer. If operating in test mode, the driver 36 outputs a test sequence as dictated by the test mode circuitry 34 which is received at the receiver 42 and monitored with the use of the detector circuitry 44. The test mode circuitry could include such testing procedures as Design For Test (DFT) and Built In Self Test (BIST).

One problem with using internal testing circuitry within the components to test the operation of the PCB is that it is relatively complicated for the test engineer to modify the test software and/or the test parameters within the test mode circuitry 34. Further, this test mode circuitry 34 requires considerable silicon space which increases the costs of the components and hence the overall PCB. Yet further, since the test mode circuitry 34 is distinct from the functional mode circuitry 32, it is not possible for the test engineer to test the components within operation using this technique.

Another technique for testing the signals within a PCB, as illustrated in FIG. 1B, is the use of probing with a test apparatus. In this case, a driver 50 within a first component 52 is coupled, via a signal trace 54, to a receiver 56 within a second component 58, the signal trace 54 further being probed relatively close to the receiver 56 by a test apparatus 60. With the use of probes on the signal trace 54, the test apparatus 60 receives a version of the signal being transmitted on the signal trace 54, thus allowing the designer to monitor the signal during the functional mode of operation. Further, this technique does not require any circuitry modifications within the actual components.

Unfortunately, there are a number of problems with this technique for testing the signals within a PCB as depicted in FIG. 1B. For one, the signal trace 54 behaves as a transmission line and so when a high speed signal traversing the signal trace 54 is probed with a low capacitance probe from the test apparatus 60, the probe itself is equivalent to a stub which can cause severe signal integrity problems, such as reflections, on the signal trace 54. Further, the test apparatus 60 being coupled to the signal trace 54 can result in a significant additional load being added to the signal trace 54. These problems may result in alterations of the signal traversing the signal trace 54, thus degrading the signal during testing and not providing accurate results of the signal during normal operating parameters. These problems increase in importance as the signal on the signal trace 54 increases in speed.

Yet further, the probing of signal traces within a PCB are becoming increasingly difficult, if not impossible. The width of a typical signal trace is decreasing while the distance between signal traces is also decreasing, resulting in an increasingly dense array of signal traces within the PCB that is difficult to probe with currently available couplers. An example of a typical dense array of signal traces is illustrated in FIG. 2 between first and second components 70, 72. In this example, the signal traces are 5 mil (a mil being equal to ¹⁄₁₀₀₀ of an inch) in width while the distance between adjacent signal traces is approximately 5 mil. Using currently available couplers, the test apparatus 60 would not be able to probe the signal traces.

Another difficulty with the probing of signal traces within current PCB designs is the plurality of layers that comprise a PCB. These layers typically include one or more signalling layers as well as a plurality ground layers that surround the signalling layers. This type of design for the PCB can prevent the test engineer from accessing any of the signals that are routed on signal traces inaccessible to the top or bottom of the PCB. To demonstrate this problem, FIGS. 3A and 3B illustrate a sample layer structure for a portion of a PCB (no components illustrated). Within FIG. 3A, the PCB comprises first and second signalling layers 80, 82 and first and second ground layers 84, 86. The first ground layer 84 in this example is on top of the first signalling layer 80 while the second ground layer 86 is beneath the second signalling layer 82. FIG. 3B illustrates the signalling layers 80, 82 of FIG. 3A with the layers separated for easier viewing of the signal traces. In this case, it can be seen that none of the signals traversing signal traces within signalling layers 80, 82 are accessible at the top or bottom layer of the PCB, these layers being the only layers to which a test engineer can attach a coupler for the test apparatus 60.

To overcome the above described problem of signal traces that are too narrow to attach probes, it has been well-known to attach small resistors to signal traces so that the test apparatus couplers are able to tap onto the resistors and hence the signal traces. Unfortunately, this solution does not overcome any of the other problems discussed above with reference to probing the signal traces with a test apparatus. For instance, the use of small resistors does not overcome the problem of degrading the signal within the signal trace or the inaccessibility of some signal traces for the test engineer. Additionally, this solution is not practical in high density databus since it would nor be possible to implement a resistor for each of the signal traces.

Hence, there is a need for a new technique for testing signals traversing signal traces of a PCB. Preferably, this technique would not significantly deteriorate the signal traversing the signal traces and would be able to be implemented within dense arrays of signal traces.

SUMMARY OF THE INVENTION

The present invention is directed to an apparatus and method for probing digital signals within a PCB. In the present invention, a sensor apparatus is implemented adjacent to a signal trace in order to receive crosstalk signalling from the signal trace. This sensor apparatus is coupled to a node that can be probed by a test apparatus so that, in essence, the signal trace itself can be probed. This node, hereinafter being referred to as a probing node, can be implemented on the same layer of the PCB as its corresponding sensor apparatus or on a different layer that is more convenient for probing purposes. Further, the sensor apparatus could be implemented on the same layer within the PCB as its corresponding signal trace or alternatively could be implemented on an adjacent layer that still allows the sensor apparatus to receive crosstalk signalling from the signal trace.

One important advantage of the present invention is the ability to achieve accurate measurements of signals traversing signal traces within a PCB without significantly affecting the signal integrity of the signals traversing the signal trace; this being especially important in high speed designs. This is done through the use of crosstalk signalling between the signal trace and the sensor apparatus, the sensor apparatus generating weak pulses equivalent to those on the signal trace that can be probed by a test apparatus. Another advantage of some implementations of the present invention is the ability to probe signals that would normally not be able to be probed due to the density of the signal trace array or due to the multiple layer implementation of the PCB.

In a first broad aspect, the present invention is an arrangement including a primary signal trace, a victim signal trace local to the primary signal trace and a probing node coupled to the victim signal trace. In this aspect, the primary signal trace operates to communicate signals between first and second components, the victim signal trace operates to receive crosstalk signalling from the primary signal trace; and the probing node is adapted for probing by a test apparatus.

The present invention, according to a second broad aspect, is an arrangement including first and second differential signal traces, at least one victim signal trace local to one of the first and second differential signal traces and at least one probing node coupled to the at least one victim signal trace. According to this aspect, the first and second differential signal traces operate to communicate signals between first and second components, the victim signal trace operates to receive crosstalk signalling from the differential signal trace that is local and the at least one probing node is adapted for probing by a test apparatus.

In other aspects, the present invention is a Printed Circuit Board (PCB) incorporating one of the arrangements of the first and second aspects. In one case, the PCB comprises a single layer that includes the primary signal trace (the differential signal traces in the second aspect), the victim signal trace and the probing node. In another case, the PCB comprises at least first and second layers, the first layer including the primary signal trace (the differential signal traces in the second aspect) and the victim signal trace and the second layer including the probing node. In this situation, the second layer is one of primary and secondary layers within the PCB and the probing node is coupled to the victim signal trace through a via coupling the first and second layers. In yet a further case, the PCB comprises at least first and second adjacent layers, the first layer including the primary signal trace (the differential signal traces in the second aspect) and the second layer including the victim signal trace. In this aspect, the victim signal trace is approximately located within the second layer at the same location as the primary signal trace (the one of the differential signal traces in the second aspect) is located within the adjacent first layer.

According to a third broad aspect, the present invention is a method of probing a signal trace that operates to communicate signals between first and second components. The method includes receiving crosstalk signalling from the primary signal trace and routing the crosstalk signalling to a node that is adapted for probing by a test apparatus.

According to a fourth broad aspect, the present invention is an arrangement including means for communicating signals between first and second components, means for receiving crosstalk signalling from the means for communicating signals, the crosstalk signalling corresponding to the signals being communicated, and means for probing the crosstalk signalling by a test apparatus.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The invention will now be described with reference to the following figures, in which:

FIGS. 7A, 7B and 7C illustrate possible implementations of the present invention within multi-layer PCBs in which a sensor apparatus is on a separate layer to its corresponding signal trace;

FIGS. 8A and 8B illustrate alternative embodiments for the sensor apparatus of any one of FIGS. 4, 6A, 6B, 7A, 7B and 7C.

DETAILED DESCRIPTION OF THE PREFERRED EMBODIMENTS

Embodiments of the present invention are directed to probing techniques within PCBS. As will be described herein below, the designs of PCBs according to the present invention utilize sensor apparatus to detect signals traversing signal traces within a PCB and further connect the sensor apparatus to corresponding probing nodes that allow a test apparatus to monitor these detected signals. These designs, in essence, allow a test apparatus, such as a Hewlett Packard (HP) high speed tester, to probe the actual signal traces within the PCB.

Figure 1A:
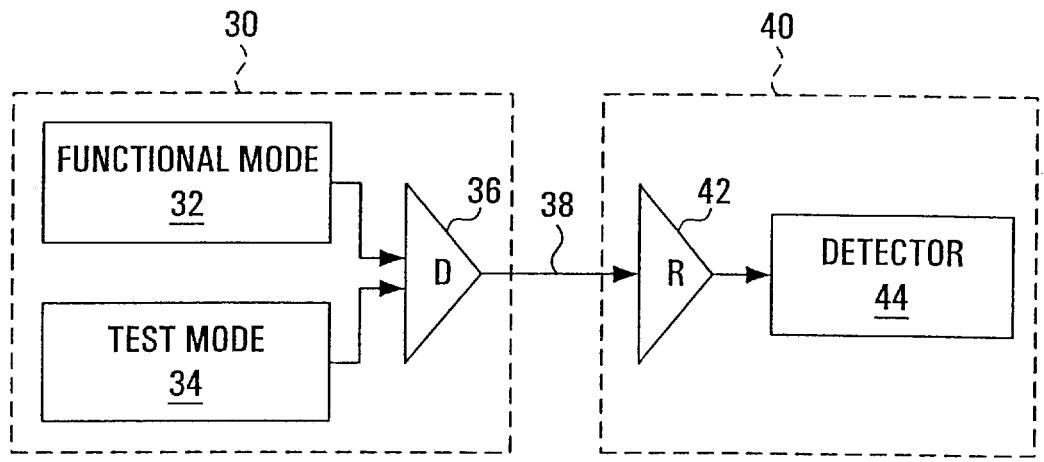
FIGS. 1A and 1B illustrate block diagrams of well-known testing techniques within a PCB.
Figure 1B:
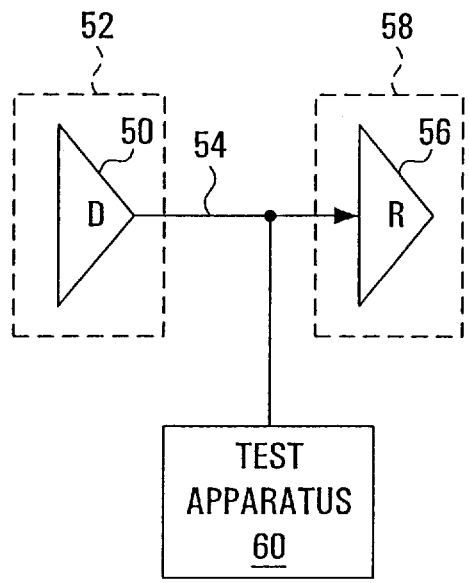
Figure 2:
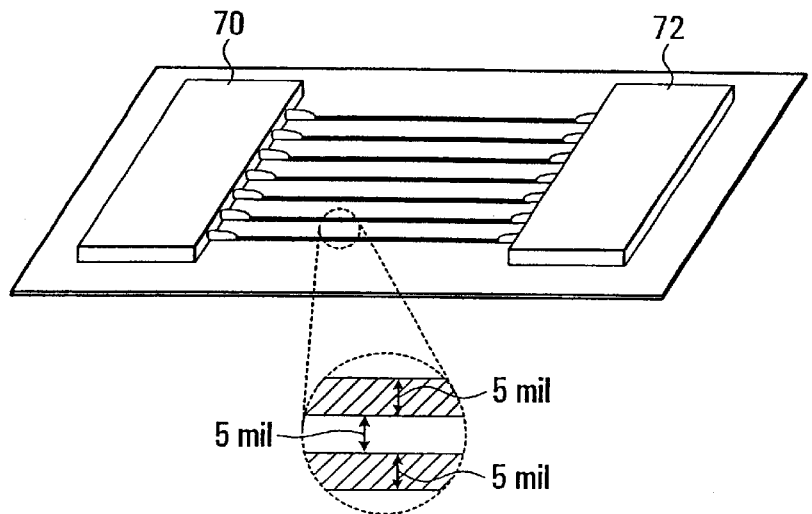
FIG. 2 illustrates a simple example of a PCB with a dense array of signal traces.
Figure 3A:
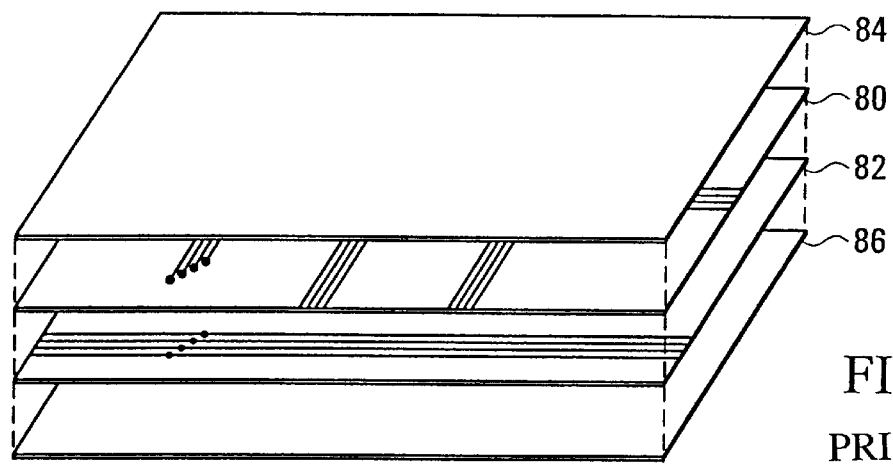
FIGS. 3A and 3B illustrates an overall view and a more detailed view respectively of a sample multi-layer PCB.
Figure 3B:
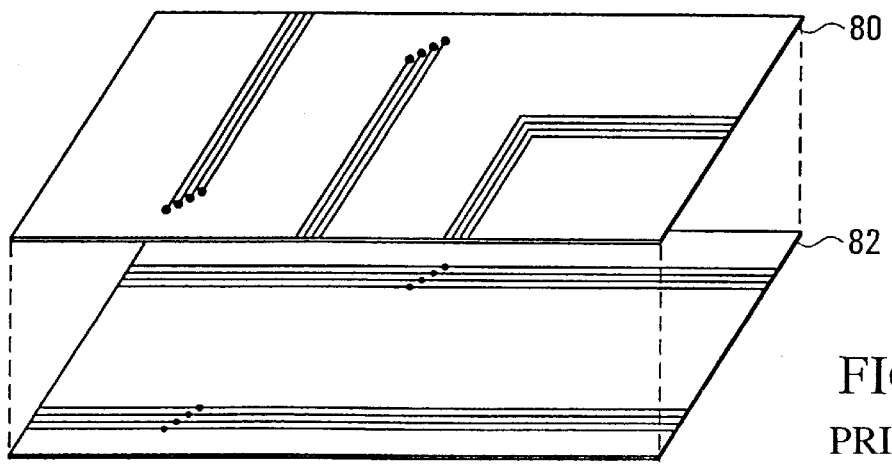
Figure 4:
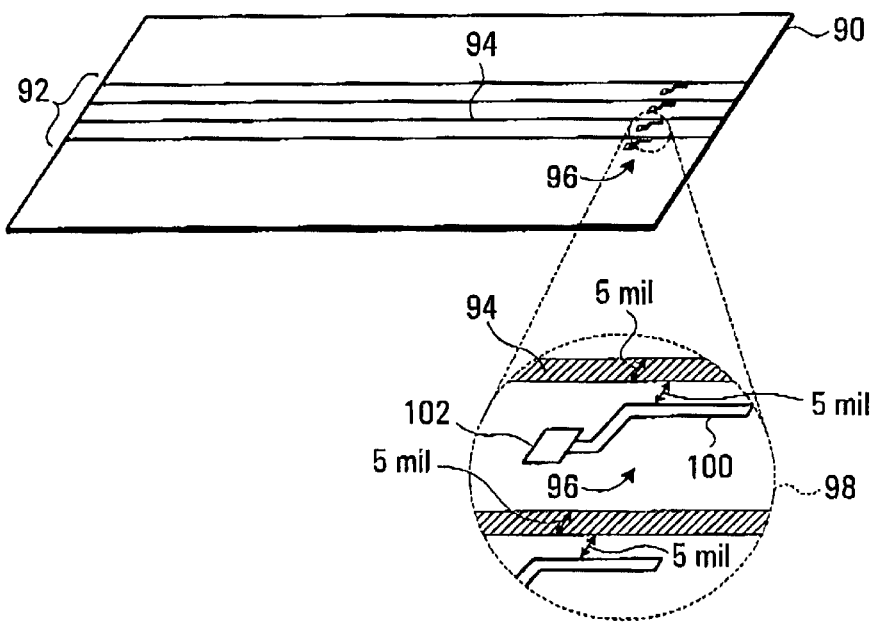
FIG. 4 illustrates a possible implementation of the present invention within a PCB.

FIG. 4 illustrates a possible implementation of the present invention within a PCB. In this implementation, the PCB comprises a signalling layer 90 which includes a databus 92 of four signal traces, one of the signal traces being signal trace 94. As depicted within FIG. 4, each of the signal traces of the databus 92 has a corresponding sensor apparatus 96 adjacent to it, the sensor apparatus 96 of signal trace 94 having a higher scaled view 98 also depicted As shown in this higher scaled view 98, the sensor apparatus 96 of FIG. 4 comprises a victim signal trace 100 that is in parallel with the signal trace of interest, signal trace 94 in this case, and a node 102 coupled to the victim signal trace 100. The victim signal trace 100 receives crosstalk signalling from the corresponding signal trace of the databus 92, this crosstalk signalling in ideally designed circumstances being a relatively accurate approximation of the digital signals traversing the signal trace 94. A more detailed description of the crosstalk signalling will be described herein below with reference to FIG. 5.

The node 102 of FIG. 4 can be utilized in a number of different manners depending upon the circumstances. In one implementation, the node 102 could be a probing node with which a test apparatus can attach a coupler in order to monitor the signals detected with the victim signal trace 100, these signals hereinafter being referred to as victim signals. In this case, the PCB of FIG. 4 must not have any further layers implemented with the signalling layer 90 that cover the node 102, the dimensions of node 102 must be sufficient for a coupler from the test apparatus to be connected and the distance between signal traces of the databus 92 must be sufficient to fit the required dimensions of the nodes 102 along with appropriate isolation of the nodes 102 from the other signal traces. In another implementation in which the PCB of FIG. 4 is a multi-layer PCB, the node 102 could be a via node to which a via couples the sensor apparatus 96 to a probing node on another layer of the PCB as will be described in detail herein below with reference to FIGS. 6A and 63. This situation is necessary if a test apparatus does not have access to layer 90 since it is not the primary or secondary layers (i.e. the top or bottom layers). Further, it might be necessary if the distance between the signal traces is not sufficient to implement the nodes 102 as probing nodes.

In the particular implementation illustrated within FIG. 4, the widths of the signal traces of the databus and the victim signal traces 100 are 5 mil while the distance between the signal traces of the databus 92 and their corresponding victim signal traces 100 is also approximately 5 mil. These are approximately the minimum dimensions that are currently achievable within PCBs.

Figure 5:
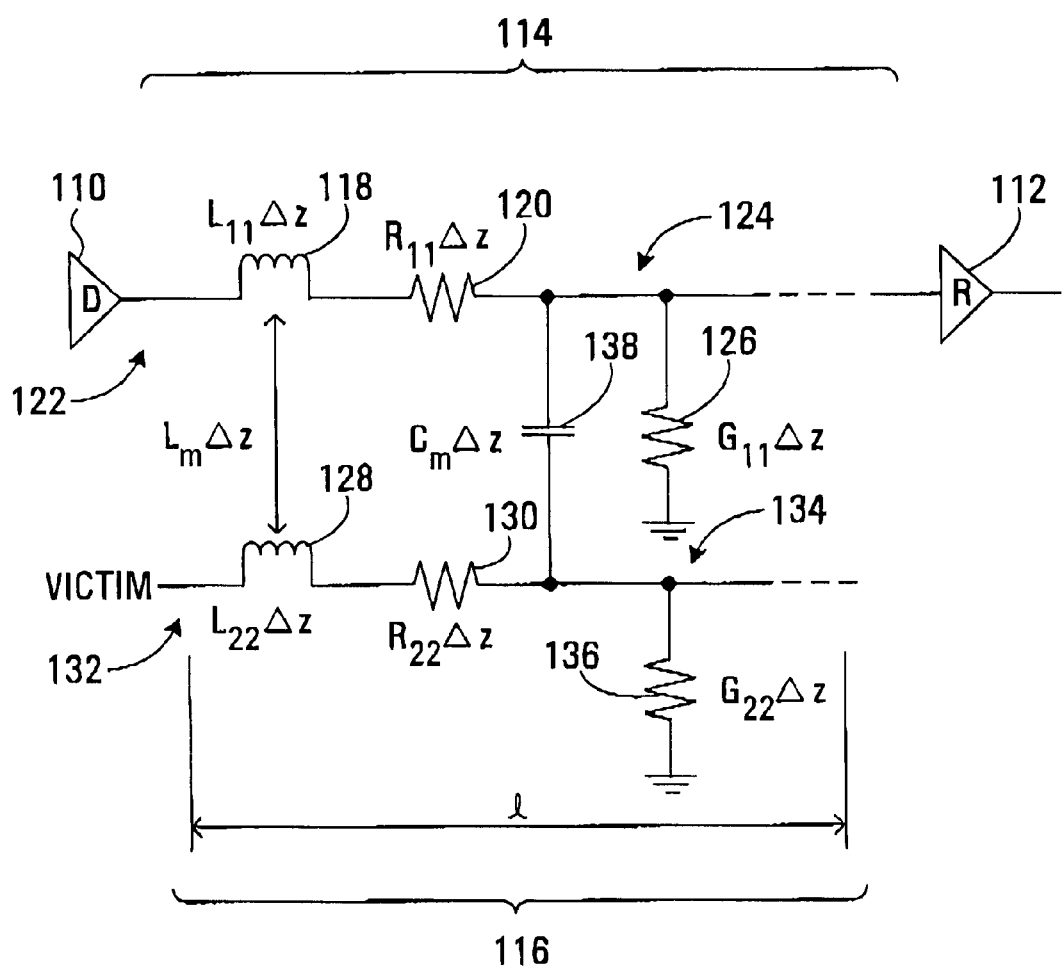
FIG. 5 illustrates an equivalent circuit for two transmission lines in parallel.

FIG. 5 illustrates an equivalent circuit for portions of two transmission lines in parallel, this circuit representing the coupling relationship between the signal trace 94 and the corresponding victim signal trace 100 of FIG. 4. As illustrated in FIG. 5, a driver 110 is coupled to a receiver 112 via a first transmission line 114 while a second transmission line 116 is in parallel with the first transmission line 114. To represent portions of the first and second transmission lines 114,116, the equivalent circuit of FIG. 5 comprises a first transmission line inductor 118 and a first transmission line resistor 120 coupled in series between first and second nodes 122, 124 respectively within the first transmission line 114; a first transmission line grounding resistor 126 coupled between the second node 124 and ground; a second transmission line inductor 128 coupled in series with a second transmission line resistor 130 between first and second nodes 132, 134 respectively within the second transmission line 116; a grounding resistor 136 coupled between the second node 134 and ground; and a crosstalk capacitor 138 coupled between the second nodes 124, 134 within the first and second transmission lines respectively.

As illustrated in FIG. 5, the inductance of the inductors 118, 128 are represented by $L_{11}\Delta z$ and $L_{22}\Delta z$ respectively, where $L_{11}, L_{22}$ are the inductance of the segments of the transmission lines 114, 116 being represented and $\Delta z$ is the length of the segments of the transmission lines 114, 116 being represented. The resistance of resistors 120, 130 are represented by $R_{11}\Delta z$ and $R_{22}\Delta z$ respectively, where $R_{11}, R_{22}$ are the self-resistance of the segments of the transmission lines 114, 116 being represented. The resistance of resistors 126, 136 are represented by $G_{11}\Delta z$ and $G_{22}\Delta z$ respectively, where $G_{11}, G_{22}$ are the admittance of the segments of the transmission lines 114, 116. The capacitance of capacitor 138 is represented by $C_m\Delta z$, where $C_m$ is the mutual capacitance between the two transmission lines 114, 116. The mutual inductance between the two transmission lines 114, 116 can be seen to be the combination of the inductance of inductors 118, 128, represented on FIG. 5 as $L_m\Delta z$.

The second transmission line 116 within FIG. 5 can receive both forward and reverse crosstalk signals from the first transmission line 114 while signals are traversing the first transmission line 114. Herein below is a description of the mathematical approximations of the voltage levels within the second transmission line 116 that result from forward and reverse crosstalk signalling while signals traverse a first transmission line 114.

For the forward crosstalk signals, the resulting voltage on the second transmission line 116 can be approximated using the following formula:

$$V_F = K_F \cdot l \cdot \frac{dV_{inc}}{dt} \qquad (1)$$

where $V_F$ is the voltage on the second transmission line 116 due to the forward crosstalk, l is the length of the entire second transmission line 116, $V_{inc}$ is the incident voltage level on the first transmission line 114 and $K_F$ is a forward crosstalk coefficient that can be approximated with the following formula:

$$K_F = -\left[\frac{L_m}{2 \cdot Z_0} - \frac{C_m \cdot Z_0}{2}\right] \qquad (2)$$

where $Z_0$ is the characteristic impedance. Looking at formulae (1) and (2), it can be seen that the voltage on the second transmission line 116 as a result of forward crosstalk signalling will be approximately equal to the change in the voltage on the first transmission line 114 multiplied by the length of the second transmission line 116 and further multiplied by the factor $K_F$ that is based upon the mutual inductance and capacitance between the transmission lines 114, 116. It is noted that since the inductance and capacitance portions of this factor $K_F$ are differential, it is possible to minimize this factor $K_F$ by adjusting these mutual inductance and capacitance levels, thus minimizing the forward crosstalk signalling detected by the second transmission line 116.

For the reverse crosstalk signals, the resulting voltage on the second transmission line 116 can be approximated using the following formula:

$$V_R = K_R \cdot V_{inc} \quad (3)$$

where $V_R$ is the voltage on the second transmission line 116 due to the reverse crosstalk, $V_{inc}$ is the incident voltage level on the first transmission line 114 and $K_R$ is a reverse crosstalk coefficient that can be approximated with the following formula:

$$K_R = \frac{1}{2 \cdot T_{prop}} \cdot \left[ \frac{L_m}{2 \cdot Z_0} + \frac{C_m \cdot Z_0}{2} \right] \quad (4)$$

where $T_{prop}$ is the unit transmission line delay time of propagation of the voltage $V_{inc}$ on the first transmission line 114. Looking at formulae (3) and (4), it can be seen that the voltage on the second transmission line 116 as a result of reverse crosstalk signalling will be approximately equal to the voltage on the first transmission line 114 multiplied by the factor $K_R$ that is based upon the mutual inductance and capacitance between the transmission lines 114, 116 and the time of propagation of the voltage $V_{inc}$ on the first transmission line 114. It is noted that, the inductance and capacitance levels within the factor $K_R$ are additive and this factor $K_R$ is directly proportional to the level of combined inductance and capacitance between the transmission lines 114, 116 and is inversely proportional to the time of propagation of the signal traversing the first transmission line 114.

Now referring back to the possible implementation of the present invention depicted within FIG. 4, it should be understood that the crosstalk signalling detected at the victim signal trace 100 due to signals traversing the signal trace 94 is comparative to the crosstalk signalling detected at the second transmission line 116 due to signals traversing the first transmission line 114. In ideal cases, the designer would eliminate the forward crosstalk signalling detected on the victim signal trace 100 by adjusting the mutual inductance and capacitance between the signal trace 94 and the victim signal trace 100. With this elimination, the crosstalk signalling detected at the victim signal trace 100 would be an approximate representation of the signals traversing the signal trace 94.

There are numerous factors that influence the effectiveness of the victim signal trace 100 to detect an accurate representation of the signals traversing the signal trace 94. For one, the length of the victim signal trace and the distance between the signal trace 94 and victim signal trace 100 can improve the strength of the reverse crosstalk signalling and hence increase the accuracy of detection for the signals traversing the signal trace 94. Through the lengthening of the victim signal trace 100 and the decreasing of space between the signal trace 94 and the victim signal trace 100, one could increase the mutual inductance and capacitance between the signal traces 94, 100 and therefore allow for stronger reverse crosstalk signalling. It is noted that the increase in strength of the reverse crosstalk signalling due to lengthening the victim signal trace 100 can be saturated such that the lengthening of the victim signal trace 100 after a threshold point, does not increase the strength of the reverse crosstalk signalling significantly. Further, it is noted the minimum possible distance between the signal trace 94 and the victim signal trace 100 is defined by PCB manufacturers' limitations. Currently, this limitation is approximately 4.5–5 mil.

Other factors that influence the effectiveness of the victim signal trace 100 to accurately detect signals traversing the signal trace 94 are the rise time at the edge of digital signals and the strength of the driver that is used to generate the signals traversing the signal trace 94. Both of these factors are not controlled by the PCB designer, but must be considered when designing the sensor apparatus of the present invention. For instance, a relatively slow rise time at the edge of digital signals may require an increase in the length of the victim signal trace 100 and/or a decrease in the distance between the signal traces 94, 100 to compensate. Further, the use of a strong voltage driver, such as a CMOS driver, or a weaker current driver, such as an LVDS driver, could force a PCB designer to adjust the sensor apparatus 96 of the present invention accordingly.

Essentially, an increase in the length of the victim signal trace 100, a decrease in the distance between the signal traces 94, 100, an increase in the rise time of the signals traversing the signal trace 94 and an increase in the strength of the driver all will lead to an increase in reverse crosstalk signalling and, hence should lead to an increased accuracy at the victim signal trace 100 of the signals traversing the signal trace 94.

Although a possible design of a PCB according to the present invention was described herein above with reference to FIG. 4, the present invention should not be limited to this embodiment. In particular, implementations are possible within multi-layer PCB designs as will be described herein below with reference to FIGS. 6A and 6B; modifications with respect to the location of the sensor apparatus 96 relative to the signal trace 94 are possible as will be described herein below with reference to FIGS. 7A through 7C; modifications with respect to the design of the victim signal trace 100 are possible as will be described with reference to FIGS. 8A and 8B; and further alternative embodiments of the present invention are possible, one of which will be described herein below with reference to FIG. 9 for differential signal designs.

Figure 6A:
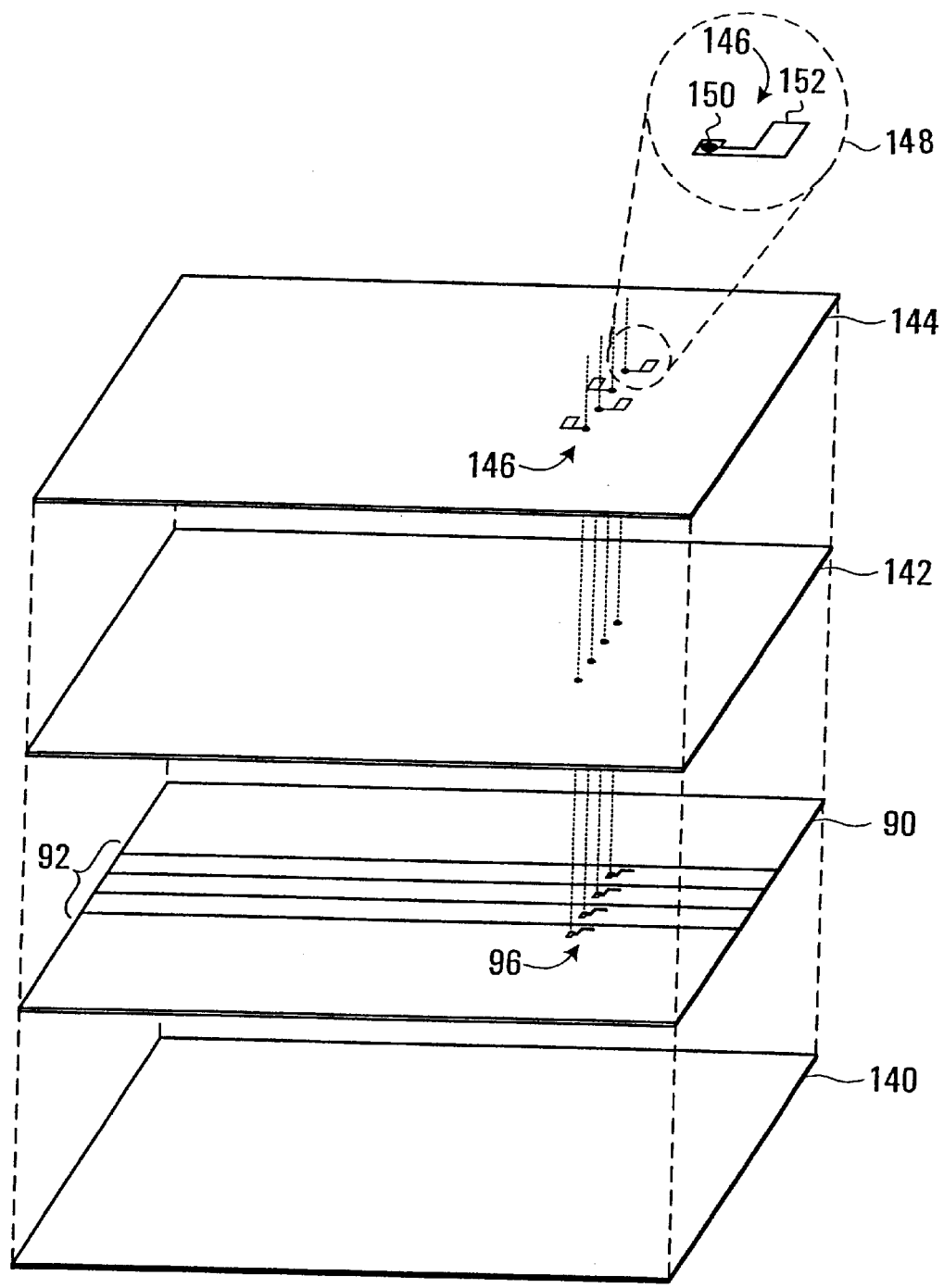
FIGS. 6A and 6B illustrate possible implementations of the present invention within multi-layer PCBs.

FIG. 6A illustrates a possible implementation of the present invention within a multi-layer PCB. As described above, the node 102 of the sensor apparatus could be a via node that is coupled through a via to another layer in a multi-layer PCB, the other layer being either the primary or secondary layer of the PCB and further having sufficient space to place a probing node of sufficient dimensions for a test apparatus. As depicted in FIG. 6A, the layer 90 previously described above with databus 92 and sensor apparatus 96 is a signalling layer within a multi-layer PCB that further comprises a first grounding layer 140 implemented below the layer 90, a second grounding layer 142 implemented above the layer 90 and a test probe layer 144 implemented above the second grounding layer 142 as the primary layer for the PCB. As depicted in FIG. 6A, the test probe layer 144 comprises a plurality of test probe apparatus 146 that are coupled to the sensor apparatus 96 with vias that run between layers 90 and 144 through layer 142. Also illustrated in FIG. 6A is a higher scale view 148 of the test probe apparatus 146, each of the test probe apparatus 146 comprising a via node 150 that is coupled to the respective via node 102 within the respective sensor apparatus 96 and a probing node 152 that is coupled to the via node 150. In this embodiment, each of the probing nodes 152 are of sufficient dimensions to allow a test apparatus to probe the node with the use of a coupler. With the implementation of FIG. 6A, victim signals detected at any of the victim signal traces 100 can be monitored by a test apparatus that attaches couplers to the probing nodes 152.

It should be noted that the present invention should not be limited to the multi-layer implementation of FIG. 6A. The layer structure of the PCB could be considerably different from that illustrated in FIG. 6A while still utilizing the present invention. For one, the test probe layer 144 could be a separate layer utilized exclusively for test probe apparatus or, alternatively, could be a layer utilized for other purposes, such as signalling, but that is accessible to couplers of a test apparatus. Further, additional layers could be added within the PCB and those layers that are depicted could be removed. In one alternative, one or more additional signalling layers could be implemented between the signalling layer 90 and the test probe layer 144. In this case, it might not be possible to route the victim signals directly from the sensor apparatus 96 to the test probe apparatus 146 due to the interference of other signal traces. In this case, it would be necessary to route the victim signals from the sensor apparatus to another signalling layer and across the other signalling layer to a point where the victim signals can be routed to the test probe layer 144 through vias. In other cases, it might be necessary to do routing on more than one other signalling layer in order to route the victim signals to the test probe layer 144.

Figure 6B:
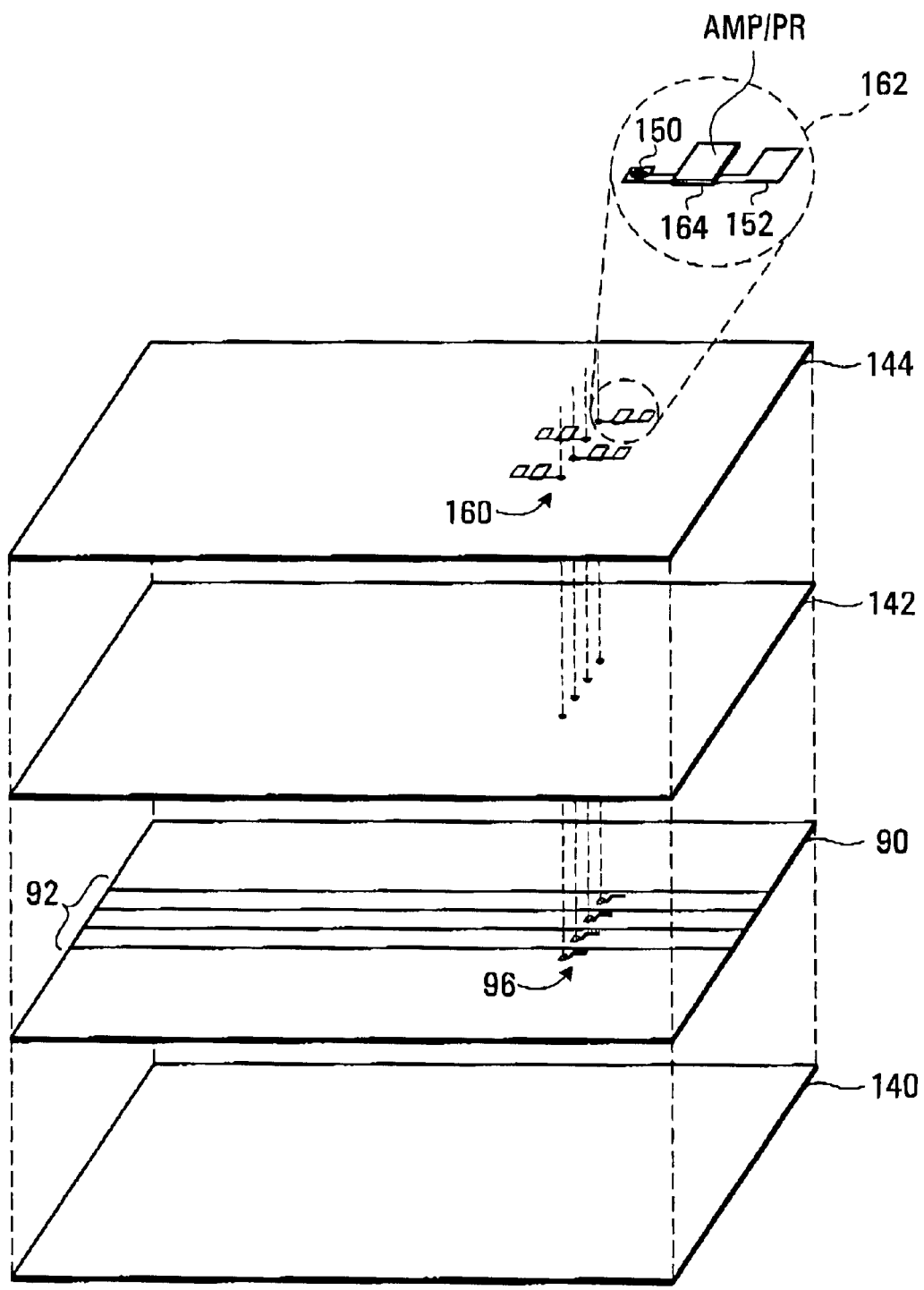

FIG. 6B illustrates another possible implementation of the present invention within a multi-layer PCB. In this implementation, the test probe apparatus 146 are replaced with test probe apparatus 160 which, as illustrated in a higher scale view 162, comprise the via node 150, the test probe node 152 and an amplifier/Pulse Recovery (PR) unit 164 coupled between the nodes 150,152. In this case, the victim signals have an amplification and pulse recovery operation performed on them prior to being probed by the test apparatus. The pulse recovery operation can be utilized to generate proper digital signals corresponding to the victim signals that are detected. In particular, this might be necessary if the forward crosstalk signalling is not significantly mitigated since unmitigated forward crosstalk signalling will result in the victim signals comprising a series of pulses rather than a relatively accurate approximation of the signals traversing the corresponding signal trace. It should be noted that this amplifier/PR unit 164 could be implemented in many different manners, such as within an FPGA, ASIC, DSP or other circuitry. Further, it should be noted this unit 164 could be implemented as two separate devices and/or further operations could also be included within the unit 164 in some alternative embodiments.

Figure 7A:
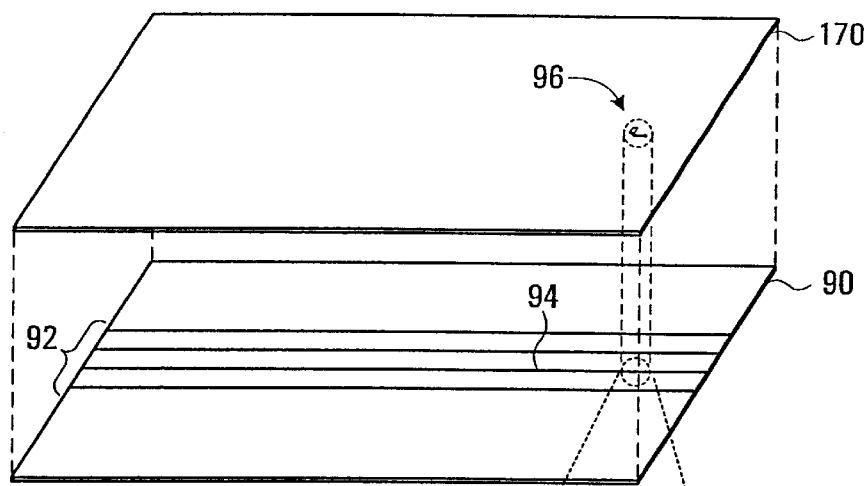
Figure 7B:
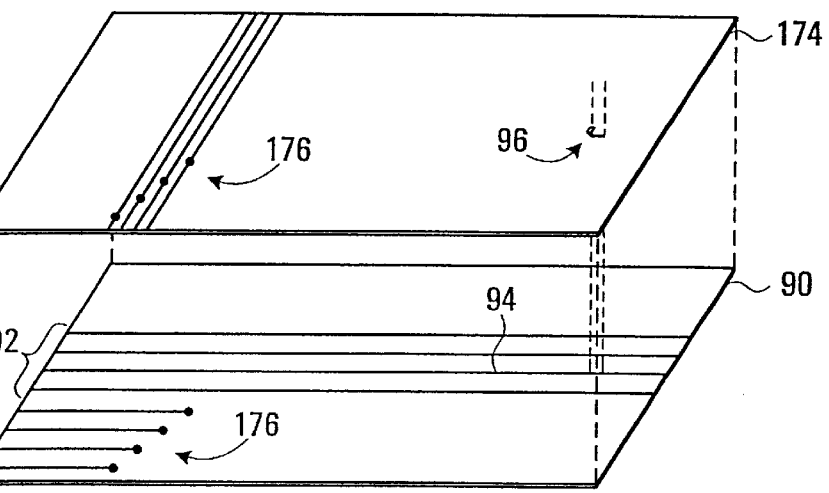

FIGS. 7A, 7B and 7C illustrate possible implementations of the present invention within multi-layer PCBs in which the sensor apparatus 96 is on a separate layer to its corresponding signal trace 94. This might be required in cases in which the distance between signal traces within a databus are not sufficient for the implementing of sensor apparatus between the signal traces. Within FIG. 7A, the PCB comprises the signalling layer 90 and a sensor apparatus layer 170 implemented above the layer 90. In this case, as depicted within a higher scale view 172 of the sensor apparatus 96 within layer 170 and the signal trace 94, the victim signal trace 100 is adjacent to the signal trace 94 within the vertical plane, hereinafter referred to as broadside coupling. The victim signal trace 100, similar to the description above for the implementation of FIG. 4, receives crosstalk signalling from the signal trace 94, this crosstalk signalling allowing the sensor apparatus 96 to generate an approximation of the actual signals traversing through the signal trace 94.

It should be noted that the sensor apparatus layer 170 could be a layer exclusively used for sensor apparatus or could alternatively be used for other functions as well. For instance, the implementation of FIG. 7B replaces the sensor apparatus layer 170 with a second signalling layer 174, layer 174 comprising signal traces 176 along with at least one sensor apparatus 96. In another alternative, the implementation of FIG. 7C replaces the sensor apparatus layer 170 of FIG. 7A with a grounding layer 178. In this case, the sensor apparatus 96, as illustrated within a higher scale view 182, is surrounded by an isolation region 180 which isolates the sensor apparatus 96 from the ground plane of the grounding layer 178.

It should be further noted that any of the implementations of FIGS. 7A through 7C could be implemented as described previously with reference to FIG. 4 in which the node 102 is a probing node or alternatively, as described previously with reference to FIGS. 6A and 6B, in which the node 102 is a via node which is coupled to a probing apparatus on one of the primary or secondary layers FIGS. 8A and 8B illustrate alternative embodiments for the sensor apparatus depicted within the implementations of FIGS. 4, 6A, 6B, 7A, 7B and 7C. These two alternative implementations of the sensor apparatus illustrate two possible modifications within the sensor apparatus in order to ensure impedance matching. Impedance matching is advantageous since reflections could be generated on the victim signal trace 100 if there is impedance mismatching, these reflections being transferred to the corresponding signal trace 94 and thus deteriorating any signals traversing this signal trace. As depicted in FIG. 8A, the sensor apparatus comprises the victim signal trace 100 with the node 102 coupled to one end and a termination device 190 coupled to the other end. As depicted in FIG. 8B, the sensor apparatus comprises the victim signal trace 100 with a first termination device 192 coupled to one end and a second termination device 194 coupled to the other end, the node 102 further being coupled to the victim signal trace 100. In the cases depicted in FIGS. 8A and 8B the termination devices are resistors, though it should be recognized that alternative devices that would result in impedance matching could be utilized.

Figure 9:
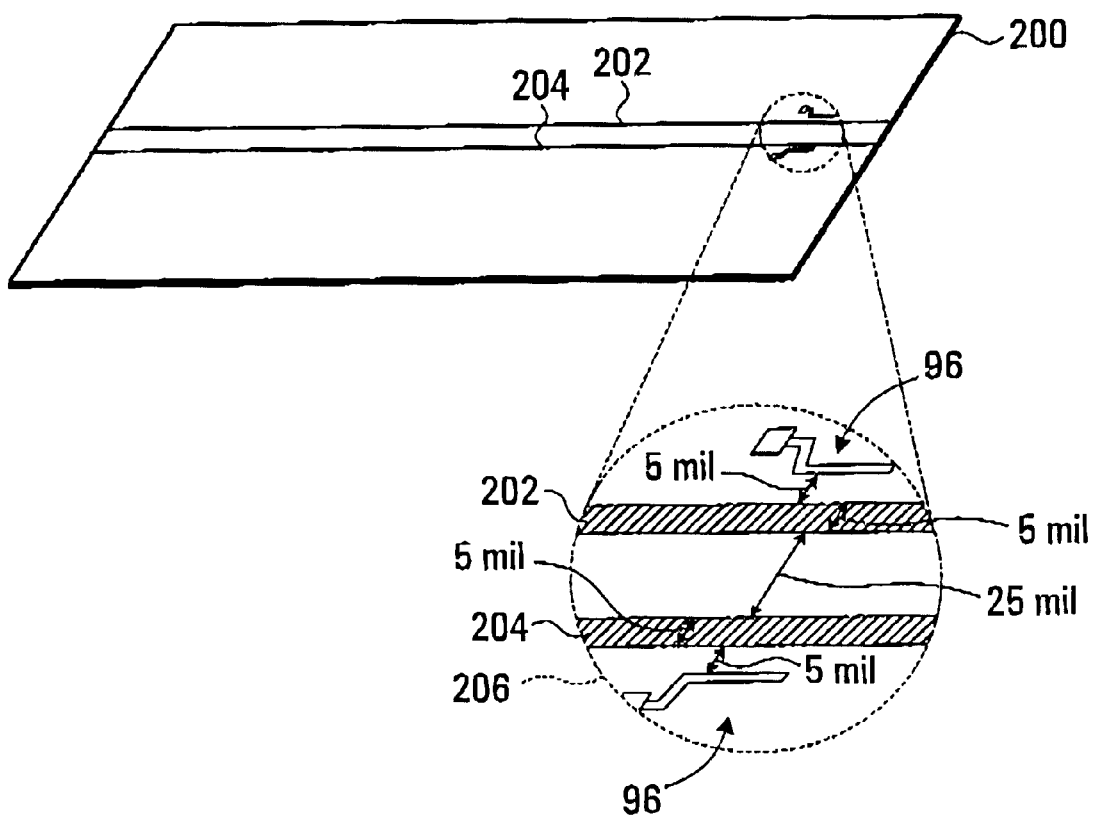
FIG. 9 illustrates a possible implementation of the present invention within a PCB utilizing differential signals.

Although a number of implementation of the present invention have been described herein above, these specific implementations should not limit the scope of the present invention. For example, rather than utilizing single ended signal traces, many current PCBs utilize differential signal traces. The use of differential signal traces becomes increasingly necessary as the speed of the signals increases, though it should be noted that the use of differential signal traces significantly increases the required distance (currently approx. 25 mil) that is used to separate the individual differential signal traces. FIG. 9 illustrates a possible implementation of the present invention within a PCB utilizing differential signals. Within FIG. 9, the CB comprises a signalling layer 200 that includes differential. signal traces 202, 204. The differential signal traces 202, 204 each have a sensor apparatus 96 adjacent to them. This is illustrated in detail within a higher scale view 206 of the sensor apparatus 96 within FIG. 9.

It should be understood that alternative implementations to the PCB of FIG. 9 are possible. For instance, only a single sensor apparatus 96 could be used rather than two as described with reference to FIG. 9. This implementation is possible if the common noise from the signal traces 202,204 is within the designer's acceptable range. In the case of two sensor apparatus 96 being utilized as depicted in FIG. 9, the differential sensor apparatus allow the test apparatus to cancel the common noise. Further, alternatives as described with reference to FIGS. 6A, 6B, 7A through 7C, 8A and 8B can also be made in circumstances in which differential signal traces are utilized.

There are numerous advantages of the present invention over previous techniques for testing signals within a PCB. For one, the use of implementations of the present invention can reduce the load being added to the signal traces. The present invention does not eliminate the loading on the signal traces that are being probed but can significantly reduce such loading compared to traditional probing techniques in which the couplers of the test apparatus are directly coupled to the signal traces of interest. This reduces within the present invention the decline in signal integrity caused by the probing of signal traces within a PCB compared to previous probing techniques.

Further, as described above, some implementations of the present invention can be implemented within PCB designs that have an extremely high dense array of signal traces. Yet further, embodiments of the present invention allow for vias that are not exposed on the primary or secondary layers, commonly referred to as micro-vias, to be probed and allow buried signal traces that cannot be traced by traditional methods to be probed.

Persons skilled in the art will appreciate that there are alternative implementations and modifications possible to use an apparatus similar to that described above to reduce peak power periods within data signals, and that the above implementation is only an illustration of this embodiment of the invention. The scope of the invention, therefore, is only to be limited by the claims appended hereto.

We claim:

1. An electrical circuit arrangement for providing connectionless signal probing comprising:
   a primary signal trace that operates to communicate signals between first and second components;
   a victim signal trace, local to the primary signal trace, that operates to receive cross-talk signalling from the primary signal trace; and
   a probing node, coupled to the victim signal trace, that is adapted for probing by a test apparatus.

2. An arrangement according to claim 1, wherein mutual inductance and capacitance between the primary signal trace and the victim signal trace are sufficient to substantially mitigate a forward portion of the crosstalk signalling received at the victim signal trace from the primary signal trace.

3. An arrangement according to claim 1, wherein the distance between the primary signal trace and the victim signal trace combined with the length of the victim signal trace allows for a reverse portion of the crosstalk signalling received at the victim signal trace to be sufficient for a test apparatus to analyse signals traversing the primary signal trace.

4. An arrangement according to claim 1 further comprising an amplifier coupled between the victim signal trace and the probing node, that operates to amplify the crosstalk signalling received at the victim signal trace.

5. An arrangement according to claim 4, wherein the distance between the primary signal trace and the victim signal trace combined with the length of the victim signal trace allows for a reverse portion of the crosstalk signalling received at the victim signal trace after being amplified by the amplifier to be sufficient for a lest apparatus to analyse signals traversing the primary signal trace.

6. An arrangement according to claim 1 further comprising a pulse recovery unit coupled between the victim signal trace and the probing node, that operates to recover any signals indicated within the crosstalk signalling received at the victim signal trace.

7. An arrangement according to claim 6 further comprising an amplifier coupled between the victim signal trace and the pulse recovery unit, that operates to amplify the crosstalk signalling received at the victim signal trace.

8. An arrangement according to claim 1, wherein the probing node is adapted for probing by a test apparatus by being of sufficient dimensions and accessibility for probing.

9. An arrangement according to claim 1 further comprising a termination device coupled to one end of the victim signal trace;
   whereby the termination device in combination with the victim signal trace provides impedance matching.

10. An arrangement according to claim 1 further comprising first and second termination devices coupled to respective ends of the victim signal trace;
    whereby the termination devices in combination with the victim signal trace provide impedance matching.

11. A Printed Circuit Board (PCB) incorporating the arrangement of claim 1, the PCB comprising a single layer that includes the primary signal trace, the victim signal trace and the probing node.

12. A Printed Circuit Board (PCB) incorporating the arrangement of claim 1, the PCB comprising at least first and second layers, the first layer including the primary signal trace and the victim signal trace and the second layer including the probing node, the second layer being one of primary and secondary layers within the PCB;
    wherein the probing node is coupled to the victim signal trace through a via coupling the first and second layers.

13. A PCB according to claim 12, wherein the second layer is a layer designed specifically for including the probing node.

14. A PCB according to claim 12, wherein the second layer further includes an amplifier coupled between the via and the probing node, the amplifier operating to amplify the crosstalk signalling received at the victim signal trace.

15. A PCB according to claim 12, wherein the second layer further includes a pulse recovery unit, coupled between the via and the probing node, that operates to recover any signals indicated within the crosstalk signalling received at the victim signal trace.

16. A PCB according to claim 15, wherein the second layer further includes an amplifier coupled between the via and the pulse recovery unit, that operates to amplify the crosstalk signalling received at the victim signal trace.

17. A Printed Circuit Board (PCB) incorporating the arrangement of claim 1, the PCB comprising at least first and second adjacent layers, the first layer including the primary signal trace and the second layer including the victim signal trace;
    wherein the victim signal trace is approximately located within the second layer at the same location as the primary signal trace is located within the adjacent first layer.

18. A PCB according to claim 17, wherein the second layer is a layer specifically designed for including the victim signal trace.

19. A PCB according to claim 17, wherein the second layer includes other signal traces that operate to communicate signals between first and second components.

20. A PCB according to claim 17, wherein the second layer is a grounding layer that further includes a ground plane, the victim signal trace being isolated from ground plane with the use of an isolation region.

21. A PCB according to claim 17, wherein the second layer further includes the probing node, the second layer being one of primary and secondary layers within the PCB.

22. A PCB according to claim 17, wherein the PCB further comprises a third layer, the third layer including the probing node, the third layer being one of primary and secondary layers within the PCB;

wherein the probing node is coupled to the victim signal trace through a via coupling the second and third layers.

23. A PCB according to claim 22, wherein the third layer is a layer designed specifically for including the probing node.

24. A PCB according to claim 22, wherein the third layer further includes an amplifier coupled between the via and the probing node, the amplifier operating to amplify the crosstalk signalling received at the victim signal trace.

25. A PCB according to claim 22, wherein the third layer further includes a pulse recovery unit, coupled between the via and the probing node, that operates to recover any signals indicated within the crosstalk signalling received at the victim signal trace.

26. A PCB according to claim 25, wherein the third layer further includes an amplifier coupled between the via and the pulse recovery unit, that operates to amplify the crosstalk signalling received at the victim signal trace.

27. An electrical circuit arrangement for providing connectionless signal probing comprising:

first and second differential signal traces that operate to communicate signals between first and second components;

at least one victim signal trace, local to one of the first and second differential signal traces, that operates to receive cross-talk signalling from the differential signal trace that is local; and at least one probing node, coupled to the at least one victim signal trace, that is adapted for probing by a test apparatus.

28. An arrangement according to claim 27, wherein the at least one victim signal trace comprises first and second victim signal traces and the at least one probing node comprises first and second probing nodes;

wherein each of the victim signal traces is local to a respective one of the first and second differential signal traces and operates to receive crosstalk signalling from the respective differential signal trace; and wherein each of probing nodes are coupled to a respective one of the victim signal traces and are adapted for probing by a test apparatus.

29. An arrangement according to claim 27, wherein mutual inductance and capacitance between the one of the differential signal traces and the victim signal trace are sufficient to substantially mitigate a forward portion of the crosstalk signalling received at the victim signal trace from the one of the differential signal traces.

30. An arrangement according to claim 27, wherein the distance between the one of the differential signal traces and the victim signal trace combined with the length of the victim signal trace allows for a reverse portion of the crosstalk signalling received at the victim signal trace to be sufficient for a test apparatus to analyse signals traversing the primary signal trace.

31. An arrangement according to claim 27 further comprising an amplifier coupled between the victim signal trace and the probing node, that operates to amplify the crosstalk signalling received at the victim signal trace.

32. An arrangement according to claim 31, wherein the distance between the one of the differential signal traces and the victim signal trace combined with the length of the victim signal trace allows for a reverse portion of the crosstalk signalling received at the victim signal trace after being amplified by the amplifier to be sufficient for a test apparatus to analyse signals traversing the differential signal traces.

33. An arrangement according to claim 27 further comprising a pulse recovery unit coupled between the victim signal trace and the probing node, that operates to recover any signals indicated within the crosstalk signalling received at the victim signal trace.

34. An arrangement according to claim 33 further comprising an amplifier coupled between the victim signal trace and the pulse recovery unit, that operates to amplify the crosstalk signalling received at the victim signal trace.

35. An arrangement according to claim 27, wherein the probing node is adapted for probing by a test apparatus by being of sufficient dimensions and accessibility for probing.

36. A Printed Circuit Board (PCB) incorporating the arrangement of claim 27, the PCB comprising a single layer that includes the differential signal traces, the victim signal trace and the probing node.

37. A Printed Circuit Board (PCB) incorporating the arrangement of claim 27, the PCB comprising at least first and second layers, the first layer including the differential signal traces and the victim signal trace and the second layer including the probing node, the second layer being one of primary and secondary layers within the PCB;

wherein the probing node is coupled to the victim signal trace through a via coupling the first and second layers.

38. A Printed Circuit Board (PCB) incorporating the arrangement of claim 27, the PCB comprising at least first and second adjacent layers, the first layer including the differential signal traces and the second layer including the victim signal trace;

wherein the victim signal trace is approximately located within the second layer at the same location as the one of the differential signal traces is located within the adjacent first layer.

39. A PCB according to claim 38, wherein the second layer further includes the probing node, the second layer being one of primary and secondary layers within the PCB.

40. A PCB according to claim 38, wherein the PCB further comprises a third layer, the third layer including the probing node, the third layer being one of primary and secondary layers within the PCB;

wherein the probing node is coupled to the victim signal trace through a via coupling the second and third layers.

41. A connectionless method of probing a signal trace that operates to communicate signals between first and second components, the method comprising;

receiving crosstalk signalling from the primary signal trace; and routing the crosstalk signalling to a node that is adapted for probing by a test apparatus.

42. An electrical circuit arrangement for providing connectionless signal probing comprising:

means for communicating signals between first and second components;

means for receiving cross-talk signalling from the means for communicating signals, the cross-talk signalling corresponding to the signals being communicated; and means for probing the cross-talk signalling by a test apparatus.

* * * * *